US009034482B2

United States Patent
Vestweber et al.

(10) Patent No.: US 9,034,482 B2
(45) Date of Patent: *May 19, 2015

(54) ORGANIC ELECTROLUMINESCENT ELEMENT

(75) Inventors: Horst Vestweber, Gilserberg-Winterscheid (DE); Anja Gerhard, Darmstadt (DE); Philipp Stössel, Frankfurt (DE)

(73) Assignee: Merck Patent GmbH (DE)

( * ) Notice: Subject to any disclaimer, the term of this patent is extended or adjusted under 35 U.S.C. 154(b) by 2125 days.

This patent is subject to a terminal disclaimer.

(21) Appl. No.: 10/571,305

(22) PCT Filed: Sep. 16, 2004

(86) PCT No.: PCT/EP2004/010379
§ 371 (c)(1),
(2), (4) Date: Mar. 9, 2006

(87) PCT Pub. No.: WO2005/034260
PCT Pub. Date: Apr. 14, 2005

(65) Prior Publication Data
US 2007/0037010 A1  Feb. 15, 2007

(30) Foreign Application Priority Data

Sep. 19, 2003 (DE) .................................. 103 43 910
Nov. 25, 2003 (DE) .................................. 103 55 381

(51) Int. Cl.
*H01L 51/54* (2006.01)
*H01L 51/00* (2006.01)
*H01L 51/50* (2006.01)

(52) U.S. Cl.
CPC ........... *H01L 51/002* (2013.01); *H01L 51/0052* (2013.01); *H01L 51/5044* (2013.01); *H01L 51/0058* (2013.01); *H01L 51/0062* (2013.01);

(Continued)

(58) Field of Classification Search
CPC .................................................. H01L 51/5044
USPC ............ 428/690, 917; 313/502–509; 257/40, 257/88–103, E51.001–E51.052
See application file for complete search history.

(56) References Cited

U.S. PATENT DOCUMENTS 6,573,651 B2 * 6/2003 Adachi et al. ................. 313/504
7,419,728 B2 * 9/2008 Ren et al. ...................... 428/690
7,588,839 B2 * 9/2009 Ren et al. ...................... 428/690

(Continued)

FOREIGN PATENT DOCUMENTS

EP     1 286 569 A1    2/2003
EP     1 308 494 A2    5/2003

(Continued)

OTHER PUBLICATIONS

Machine Translation of JP 2002-063989. (Feb. 2002).*
Huang et al., "High-brightness organic double-quantum-well electroluminescent devices," Applied Physics Letters, vol. 77, No. 12, pp. 1750-1752, Sep. 2000.*
Adachi et al., "Architectures for efficient electrophosphorescent organic light-emitting devices," IEEE Journal of Selected Topics in Quantum Electronics, vol. 8, No. 2, pp. 372-377, Mar./Apr. 2002.*

(Continued)

*Primary Examiner* — Marie R. Yamnitzky
(74) *Attorney, Agent, or Firm* — Drinker Biddle & Reath LLP (57) ABSTRACT

The present invention relates to the improvement of organic electroluminescent devices which consist of a certain matrix material which has been doped with at least one phosphorescent emitter, and which are characterized in that the doping zone of the emitter in the matrix at right angles to the layer extends only over a part of the matrix layer.

21 Claims, 3 Drawing Sheets (52) U.S. Cl.
CPC ......... *H01L 51/0085* (2013.01); *H01L 51/5016* (2013.01); *Y10S 428/917* (2013.01)

(56) References Cited

U.S. PATENT DOCUMENTS

| | | | |
|---|---|---|---|
| 2002/0101154 A1* | 8/2002 | Seo et al. | 313/506 |
| 2003/0218418 A9* | 11/2003 | Sato et al. | 313/504 |

FOREIGN PATENT DOCUMENTS

| | | | |
|---|---|---|---|
| JP | 2002063989 | * | 2/2002 |
| JP | 2003-261471 | | 9/2003 |
| WO | WO 2004/016709 A1 | | 2/2004 |

OTHER PUBLICATIONS

Adachi, C. et al., "Efficient Electrophosphorescence Using a Doped Ambipolar Conductive Molecular Organic Thin Film," *Organic Electronics*, 2:37-43 (2001).

Baldo, M.A. et al., "Highly Efficient Phosphorescent Emission from Organic Electroluminescent Devices," *Nature*, 395:151-154 (1998).

Salbeck, J. et al., "Low Molecular Organic Glasses for Blue Electroluminescence," *Synthetic Metals* 91:209-215 (1997).

Wu, C.C. et al., "Highly Bright Blue Organic Light-Emitting Devices Using Spirobifluorene-cored Conjugated Compounds," *Applied Physics Letters*, 81(4):577-579 (2002).

* cited by examiner

Figure 1

| Cathode |
| --- |
| EIL |
| ETL |
| (Matrix layer undoped) Zone 1 |
| (Matrix layer doped) Zone 1 |
| HTL |
| HIL |
| Anode |

Figure 2

| Cathode |
| --- |
| EIL |
| ETL |
| (Matrix layer undoped) Zone 2 |
| (Matrix layer doped) Zone 2 |
| (Matrix layer undoped) Zone 1 |
| (Matrix layer doped) Zone 1 |
| HTL |
| HIL |
| Anode |

Figure 3

| Cathode |
| --- |
| EIL |
| ETL |
| (Matrix layer doped) Zone 1 |
| (Matrix layer undoped) Zone 1 |
| HTL |
| HIL |
| Anode |

Figure 4

| Cathode |
| --- |
| EIL |
| ETL |
| (Matrix layer doped) Zone 2 |
| (Matrix layer undoped) Zone 2 |
| (Matrix layer doped) Zone 1 |
| (Matrix layer undoped) Zone 1 |
| HTL |
| HIL |
| Anode |

Figure 5

| Cathode |
| --- |
| EIL |
| ETL |
| (Matrix layer undoped) Zone 1 |
| (Matrix layer doped) Zone 1 |
| (Matrix layer undoped) Zone 1 |
| HTL |
| HIL |
| Anode |

Figure 6

| Cathode |
| --- |
| EIL |
| ETL |
| (Matrix layer undoped) Zone 1 |
| (Matrix layer doped) Zone 1 |
| (Matrix layer undoped) Zone 1 or 2 |
| (Matrix layer doped) Zone 2 |
| (Matrix layer undoped) Zone 2 |
| HTL |
| HIL |
| Anode |

Figure 7

Figure 8

Figure 9:
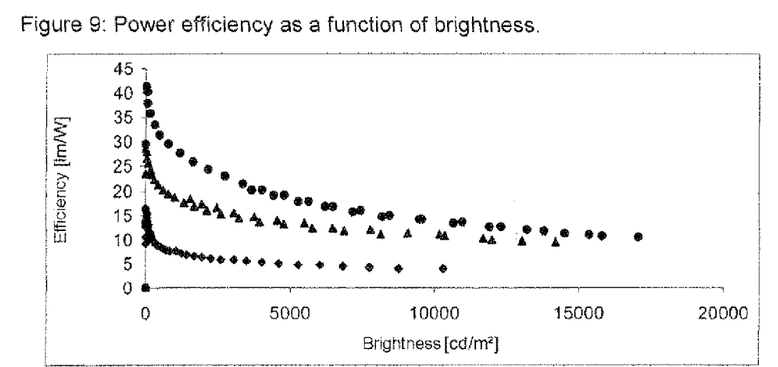

Figure 9: Power efficiency as a function of brightness.

ORGANIC ELECTROLUMINESCENT ELEMENT

RELATED APPLICATIONS

This application is the U.S. National Stage of International Application No. PCT/EP2004/0103795, filed Sep. 16, 2004, published in German, and claims priority under 35 U.S.C. §119 or 365 to German Application No. 103 43 910.2, filed Sep. 19, 2003 and German Application 103 55 381.9, filed Nov. 25, 2003.

The present invention describes a new type of design principle for organic electroluminescent elements and its use in displays based thereon.

In a series of different types of applications which can be classified within the electronics industry in the widest sense, the use of organic semiconductors as functional materials has become reality in recent times or is expected in the near future. For instance, light-sensitive organic materials (e.g. phthalocyanines) and organic charge transport materials (generally triarylamine-based hole transporters) have already found use for several years in copying machines. The use of semiconducting organic compounds, some of which are also capable of emission of light in the visible spectral region, is just starting to be introduced onto the market, for example in organic electroluminescent devices. Their individual components, the organic light-emitting diodes (OLEDs), have a very wide spectrum of application as:

1. white or colored backlighting for monochrome or multicolor display elements (for example in pocket calculators, for mobile telephones, etc.),
2. large-surface area displays (for example traffic signs, billboards, etc.),
3. illumination elements in all colors and forms,
4. monochrome or full-color passive matrix displays for portable applications (for example mobile telephones, PDAs, camcorders, etc.),
5. full-color, large-surface area, high-resolution active matrix displays for a wide variety of applications (for example mobile telephones, PDAs, laptops, televisions, etc.).

The development of some of these applications is already very far advanced; nevertheless, there is still great need for technical improvements.

Devices containing relatively simple OLEDs have already been introduced onto the market, as demonstrated by the car radios from Pioneer, the mobile telephones from Pioneer and SNMD or a digital camera from Kodak with an organic display. However, there are still considerable problems which are in need of urgent improvement:

1. For instance, the operative lifetime in particular of OLEDs is still low, so that it has only been possible to date to commercially realize simple applications.
2. This relatively short lifetime gives rise to a further problem: specifically for full-color applications (full-color displays), i.e. displays which do not have any segmentations, but rather can show all colors over the whole surface, it is particularly bad when the individual colors age here at different rates, as is currently the case. This leads, even before the end of the abovementioned lifetime (which is generally defined by a decline to 50% of the starting brightness), to a distinct shift of the white point, i.e. the trueness of color of the representation in the display becomes very poor. In order to avoid this, some display manufacturers define the lifetime as the 70% or 90% lifetime (i.e. decline in the starting brightness to 70% or 90% of the starting value). However, this leads to the lifetime becoming even shorter.
3. Although the efficiencies, especially the power efficiency (measured in lm/W), of OLEDs are acceptable, improvements are still of course desired here too.
4. The aging processes are generally accompanied by a rise in the voltage. This effect makes voltage-driven organic electroluminescent devices difficult or impossible. However, current-driven addressing is more complex and costlier precisely in this case.
5. The required operating voltage is quite high specifically in the case of efficient phosphorescent OLEDs and therefore has to be reduced in order to improve the power efficiency. This is of great significance specifically for portable applications.
6. The required operating current has likewise been reduced in the last few years, but has to be reduced still further in order to improve the power efficiency.
7. The structure of the OLEDs is complex and expensive as a result of the multitude of organic layers; a reduction in the number of layers is very important for production in order to reduce the production steps and thus to lower the costs and to increase the production reliability.

The problems mentioned above make improvements in the production of OLEDs necessary. A development in this direction which has emerged in recent years is the use of organometallic complexes which exhibit phosphorescence instead of fluorescence [M. A. Baldo, S. Lamansky, P. E. Burrows, M. E. Thompson, S. R. Forrest, *Appl. Phys. Lett.* 1999, 75, 4-6]. For quantum-mechanical reasons, up to four times the quantum efficiency, energy efficiency and power efficiency are possible using organometallic compounds. Whether this new development will establish itself depends strongly upon whether corresponding device compositions can be found which can also utilize these advantages (triplet emission=phosphorescence compared to singlet emission=fluorescence) in OLEDs. The essential conditions for practical use here are in particular a high operative lifetime, a high stability against thermal stress and a low use and operating voltage in conjunction with a high power efficiency in order to enable mobile applications.

The general structure of fluorescent organic electroluminescent devices is described, for example, in U.S. Pat. No. 4,539,507 and U.S. Pat. No. 5,151,629. Typically, an organic electroluminescent device consists of a plurality of layers which are applied by means of vacuum methods or various printing techniques. For phosphorescent organic electroluminescent devices, these layers are specifically:

1. A carrier plate=substrate (typically glass or plastics film).
2. A transparent anode (typically indium tin oxide, ITO).
3. A hole injection layer (Hole Injection Layer=HIL): for example based on copper-phthalocyanine (CuPc) or conductive polymers such as polyaniline (PANI) or polythiophene derivatives (such as PEDOT).
4. One or more hole transport layers (Hole Transport Layer=HTL): typically based on triarylamine derivatives, for example 4,4',4''-tris(N-1-naphthyl-N-phenylamino)-triphenylamine (NaphDATA) as the first layer and N,N'-di(naphth-1-yl)-N,N'-diphenyl-benzidine (NPB) as the second hole transport layer.
5. One or more emission layers (Emission Layer=EML): consists typically of matrix materials, such as 4,4'-bis(carbazol-9-yl)biphenyl (CBP), doped with phosphorescent dyes, for example tris(phenylpyridyl)iridium (Ir(PPy)$_3$) or tris(2-benzothiophenylpyridyl)iridium (Ir(BTP)$_3$). However, the emission layer may also consist of polymers, mixtures of polymers, mixtures of polymers and low molecular weight compounds or mixtures of different low molecular weight compounds.

6. A hole blocking layer (Hole Blocking Layer=HBL): consists typically of BCP (2,9-dimethyl-4,7-diphenyl-1,10-phenanthroline=bathocuproin) or bis(2-methyl-8-quinolinolato)-(4-phenylphenolato)aluminum(III) (BAlq).
7. An electron transport layer (Electron Transport Layer=ETL): usually based on aluminum tris-8-hydroxyquinolinate ($AlQ_3$).
8. An electron injection layer (Electron Injection Layer=EIL) (also sometimes known as Insulator Layer (ISL)): a thin layer consisting of a material with a high dielectric constant, for example LiF, $Li_2O$, $BaF_2$, MgO, NaF.
9. A cathode: here, generally metals, metal combinations or metal alloys having a low work function are used, for example Ca, Ba, Cs, Mg, Al, In, Mg/Ag.

This whole device is appropriately (depending on the application) structured, contacted and finally also hermetically sealed, since the lifetime of such devices is generally shortened drastically in the presence of water and/or air. The same also applies to what are known as inverted structures in which the light is emitted from the cathode. In these inverted OLEDs, the anode consists, for example, of Al/Ni/NiOx or Al/Pt/PtOx or other metal/metal oxide combinations which have a HOMO with an energy of greater than 5 eV. The cathode consists of the same materials as described in point 8 and 9, with the difference that the metal, for example Ca, Ba, Mg, Al, In, etc., is very thin and thus transparent. The layer thickness is below 50 nm, better below 30 nm, even better below 10 nm. A further transparent material can also be applied to this transparent cathode, for example ITO (indium tin oxide), IZO (indium zinc oxide), etc.

The use of hole blocking layers (HBL) following the emitter layer composed of a phosphorescent emitter and a matrix material for enhancing the efficiency and the lifetime in organic electroluminescent devices has been known for some time.

As is evident from the above-described structure of a phosphorescent OLED, this is very costly and inconvenient, since many layers, which in turn consist of many different materials, have to be applied successively, which makes the production process of commercial OLEDs very complicated. These structures are usually optimized according to the criterion of greatest efficiency. Frequently, BCP is used as the hole blocking material (HBM), which, however, has the great disadvantage that it greatly restricts the lifetime of the OLEDs. A further hole blocking material is bis(2-methyl-8-hydroxyquinolato)(4-phenylphenolato)-aluminum(III) (BAlq). This allowed the stability and lifetime of the devices to be improved, but with the side effect that the quantum efficiency of the devices is distinctly (approx. 40%) lower than with BCP (T. Watanabe et al., Proc. SPIE 2001, 4105, 175). Kwong et al. (*Appl. Phys. Lett.* 2002, 81, 162) thus achieved lifetimes of 10 000 h at 100 cd/$m^2$ with tris(phenylpyridyl)iridium(III). However, this device exhibited only an efficiency of 19 cd/A, which is far inferior to the state of the art. Thus, BAlq is not a satisfactory hole blocking material overall, since the efficiency achieved is too low.

To date, there have been several attempts to solve this problem. In particular, new classes of matrix materials have been proposed which make the use of HBLs superfluous.

EP 1308494 describes OLEDs in which the emission layer (EML) consists of a matrix material with electron-conducting properties doped with a phosphorescent emitter. A disadvantage of the OLEDs described here is that the highest efficiencies are not achieved in this structure. Only the lifetime is improved, which is, though, paid for with a loss of efficiency.

US 2003/0146443 describes OLEDs in which the emission layer (EML) consists of a matrix material with electron-conducting properties doped with a phosphorescent emitter. This simplifies the layer structure since only one further hole transport layer is used. However, these OLEDs do not achieve the same efficiency as conventionally structured OLEDs, i.e. with use of an HBL. In some cases, an emission, albeit a small one, of the matrix used is observed. An aspect of the prior art criticized by the authors is that the lifetime of the conventional OLEDs is too low since the materials used in the HBL have too low a stability. However, they do not themselves make any statements on the lifetimes and stabilities of the structures produced by them. This leads to the suspicion that the structures presented there do not solve the problem of low stability.

C. Adachi et al. (*Organic Electronics* 2001, 2, 37) describe phosphorescent OLEDs in which the carbazole-containing matrix (CBP) is not entirely doped with the triplet emitter and in which no hole blocking material is used, as a result of which an undoped CBP layer is present between emitter layer and cathode. However, distinctly poorer efficiencies (in the region of more than one order of magnitude) are achieved in this case than when the matrix layer is fully doped, irrespective of whether a separate hole blocking layer is used or not. The greater the undoped fraction, the poorer is the efficiency achieved. Distinct disadvantages thus result here when the matrix is only partly doped. It is also found that the emission color of the device is distinctly shifted when the matrix is only partly doped. While the device with the fully doped matrix exhibits the green emission of the triplet emitter, the emission color is shifted to the blue emission of the hole transport material when the partly doped matrix is used. It is thus apparent that matrix materials based on carbazole are not suitable for fully doping.

It is clear from this description of the prior art that, especially for efficient OLEDs, hole blocking materials (HBM) for example BCP or BAlq, have been required to date but lead to unsatisfactory side effects. It has now been found that, surprisingly, OLEDs which correspond to the inventive design principle detailed below have distinct improvements over this prior art. It has also been found that a separate electron transport layer does not necessarily have to be used with this design principle, as a result of which the structure of the OLEDs is considerably simplified. Moreover, distinctly higher power efficiencies are achieved with this structure.

The invention therefore provides an organic electroluminescent device comprising an anode, a cathode and at least one matrix layer comprising at least one matrix material which contains a structural unit of the formula Y=X where X has at least one nonbonding electron pair and where the Y radical is C, P, As, Sb, Bi, S, Se or Te and the X radical is N, O, S, Se or Te, and which has been doped with at least one phosphorescent emitter, characterized in that the doping zone of the emitter in the matrix at right angles to the layer extends only over part of the matrix layer.

In the aforementioned general formula Y=X, "=" represents a double bond.

An organic electroluminescent device is preferably characterized in that the matrix material of the formula Y=X comprises a compound of the formula (1) to (4) (scheme 1), (Scheme 1)

formula (1)
formula (2)
formula (3)
formula (4)

where the symbols used are each defined as follows:

Y is C in formula (2) and is P, As, Sb or Bi in formula (1) and (3), and is S, Se or Te in formula (1), (2) and (4);

X is the same or different at each instance and is $NR^1$, O, S, Se, Te;

R is the same or different at each instance and is H, F, CN, $N(R^1)_2$, a straight-chain, branched or cyclic alkyl, alkoxy or thioalkoxy group which has from 1 to 40 carbon atoms and may be substituted by $R^1$ or else unsubstituted, where one or more nonadjacent $CH_2$ groups may be replaced by $-R^2C=CR^2-$, $-C\equiv c-$, $Si(R^2)_2$, $Ge(R^2)_2$, $Sn(R^2)_2$, C=O, C=S, C=Se, $C=NR^2$, $-O-$, $-S-$, $-NR^2-$ or $-CONR^2-$ and where one or more hydrogen atoms may be replaced by F, Cl, Br, I, CN, $B(R^2)_2$, $Si(R^2)_3$ or $NO_2$, or an aromatic or heteroaromatic ring system or an aryloxy group which has from 1 to 40 carbon atoms and may be substituted by one or more $R^1$, CN, $B(R^2)_2$ or $Si(R^2)_3$ radicals, where a plurality of substituents R together may form a mono- or polycyclic, aliphatic or aromatic ring system;

$R^1$ is the same or different at each instance and is a straight-chain, branched or cyclic alkyl or alkoxy chain having from 1 to 22 carbon atoms, in which one or more nonadjacent carbon atoms may also be replaced by $-R^2C=CR^2-$, $-C\equiv C-$, $Si(R^2)_2$, $Ge(R^2)_2$, $Sn(R^2)_2$, $-NR^2-$, $-O-$, $-S-$, $-CO-O-$ or $-O-CO-O-$, where one or more hydrogen atoms may also be replaced by fluorine, an aryl, heteroaryl or aryloxy group which has from 1 to 40 carbon atoms and may also be substituted by one or more $R^2$ radicals, or OH or $N(R^2)_2$;

$R^2$ is the same or different at each instance and is H or an aliphatic or aromatic hydrocarbon radical having 1 to 20 carbon atoms;

with the proviso that the molar mass of the matrix material is greater than 150 g/mol. In the context of this invention, an aromatic or heteroaromatic ring system shall be understood to mean a system which does not necessarily comprise only aromatic or heteroaromatic groups, but rather in which a plurality of aromatic or heteroaromatic groups may also be interrupted by a short nonaromatic unit (<10% of the atoms other than H, preferably <5% of the atoms other than H), for example $sp^3$-hybridized C, O, N, etc. For example, systems such as 9,9'-spirobifluorene, 9,9-diarylfluorene, triarylamine, diphenyl ether, etc., shall thus also be understood to be aromatic systems.

Matrix materials from the classes of the ketones and imines are, for example, described in the unpublished patent application DE 10317556.3; matrix materials from the classes of the phosphine oxides, of the phosphine sulfides, of the phosphine selenides, of the phosphazenes, of the sulfones and of the sulfoxides are, for example, described in the unpublished patent application DE 10330761.3. Preference is given to ketones, phosphine oxides and sulfoxides, i.e. materials for which Y=C, P, S and X=O; particular preference is given to ketones, i.e. materials for which Y=C and X=O.

In this context, materials which contain more than one Y=X group are thus explicitly also possible and suitable.

Particularly suitable matrix materials have been found to be compounds which do not have a planar structure. On the structural unit of the Y=X form, appropriate substituents can ensure deviation of the overall structure from planarity. This is the case especially when at least one of the substituents R contains at least one $sp^3$-hybridized carbon, silicon, germanium and/or nitrogen atom which thus has approximately tetrahedral or, in the case of nitrogen, pyramidal bonding geometry. In order to achieve a distinct deviation from planarity, it is preferred when at least one of the $sp^3$-hybridized atoms is a secondary, tertiary or quaternary atom, more preferably a tertiary or quaternary atom, and in the case of carbon, silicon or germanium most preferably a quaternary atom. A secondary, tertiary or quaternary atom is understood to mean an atom with two, three and four substituents other than hydrogen respectively.

Preference is given to compounds which contain, in at least one of the R radicals, a 9,9'-spirobifluorene derivative, preferably bonded via the 2- and/or 2,7- and/or 2,2'- and/or 2,2',7- and/or 2,2',7,7'-position, a 9,9-disubstituted fluorene derivative, preferably bonded via the 2- and/or 2,7-position, a 6,6- and/or 12,12-di- or tetrasubstituted indenofluorene derivative, a triptycene derivative, preferably bonded via the 9- and/or 10-position, a dihydrophenanthrene derivative, preferably bonded via the 2- and/or 2,7-position, a hexaarylbenzene derivative, preferably bonded via the p-position to the aromatic(s), or a tetraarylmethane derivative, preferably bonded via the p-position to the aromatic(s).

Particular preference is given to compounds which contain a 9,9'-spirobifluorene derivative in at least one of the R radicals.

Preference is further given to an organic electroluminescent device, characterized in that the glass transition temperature $T_g$ of the matrix material is greater than 100° C., preferably greater than 120° C., most preferably greater than 140° C.

It may be preferred when the organic electroluminescent device, apart from the layers mentioned above, also comprises one or more hole injection layers (HIL) and/or hole transport layers (HTL). It may also be preferred when the organic electroluminescent device, apart from the layers mentioned above, also comprises one or more electron transport layers (ETL) and/or electron injection layers (EIL). It is also possible in principle to use separate hole blocking layers (HBL), but their use in the inventive device structure is not necessary and therefore also not preferred.

Preference is given to an organic electroluminescent device, characterized in that one or more doping zones are present in the matrix layer and one or more undoped zones are present in the matrix layer and an undoped zone in the matrix layer adjoins the electron transport layer ETL (or EIL or cathode) and a doping zone in the matrix layer adjoins the hole transport layer HTL (or HIL or anode).

Figure 1:
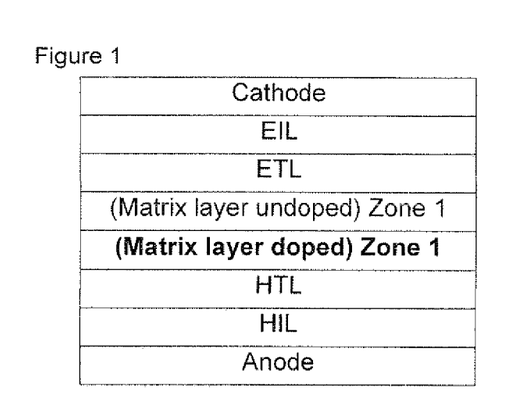

One possible embodiment of the invention is described in FIG. 1. The matrix layer consists here of a doped and undoped region, the doped region adjoining the HTL and the undoped region the ETL. Even if this is evident from the description, it should be pointed out that the matrix material in the doped and undoped matrix layer (both zone 1) is identical.

It should be pointed out explicitly that, in FIG. 1 (Oust like in all figures which follow), the use of a separate EIL, ETL, HTL and/or HIL is not absolutely necessary and that the uses of these layers are only possible embodiments of the invention. The depiction of these layers in FIG. 1 to 8 should thus only be regarded as an example and is not intended to restrict the general performance of this invention. Equally, corresponding devices without these layers are in accordance with the invention.

Figure 2:
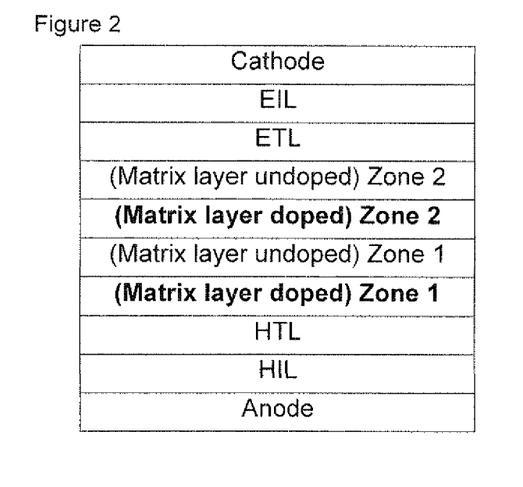

A further possible embodiment of the invention is described in FIG. 2. The matrix layer consists of two doped and two undoped regions, one doped region adjoining the HTL and one undoped region the ETL. Even if this is evident from the description, it should be pointed out explicitly once again that the matrix material is identical in each individual zone, and is preferably identical in all zones.

The matrix layer may also consist of three or more doped and undoped regions. Two or three alternating doped and undoped regions are particularly suitable for white-emitting OLEDs.

Preference is further given to an organic electroluminescent device, characterized in that one or more doping zones are present in the matrix layer and one or more undoped zones are present in the matrix layer and an undoped zone in the matrix layer adjoins the hole transport layer HTL (or HIL or anode) and a doping zone in the matrix layer adjoins the electron transport layer ETL (or EIL or cathode).

Figure 3:
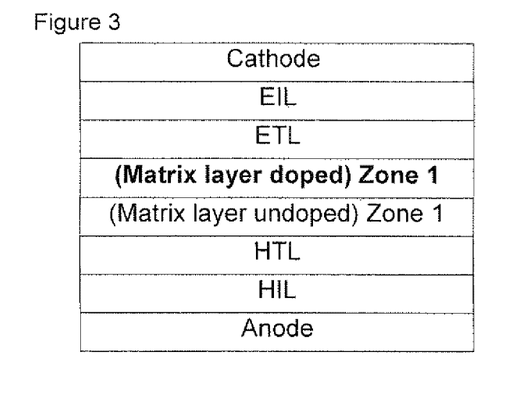

A further possible embodiment of the invention is described in FIG. 3. The matrix layer consists of a doped and undoped region, the doped region adjoining the ETL and the undoped region the HTL. Even if this is evident from the description, it should be pointed out explicitly once again that the matrix material in the doped and undoped matrix layer (both zone 1) is identical.

Figure 4:
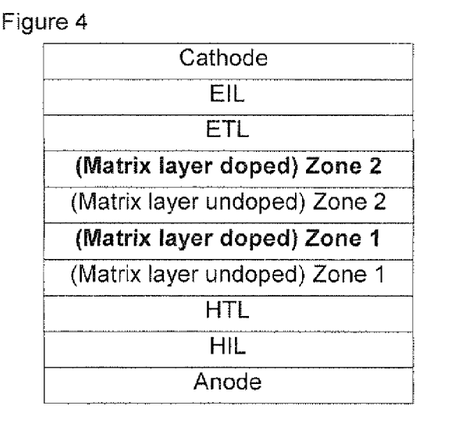

A further possible embodiment of the invention is described in FIG. 4. The matrix layer consists of two doped and undoped regions, one doped region adjoining the ETL and one undoped region the HTL. Even if this is evident from the description, it should be pointed out explicitly once again that the matrix material is identical in each individual zone, and is preferably identical in all zones.

Preference is given to an organic electroluminescent device, characterized in that one or more doping zones are present in the matrix layer and one or more undoped zones are present in the matrix layer and an undoped zone in the matrix layer adjoins the electron transport layer ETL (or EIL or cathode) and an undoped zone adjoins the hole transport layer HTL (or HIL or anode).

Figure 5:
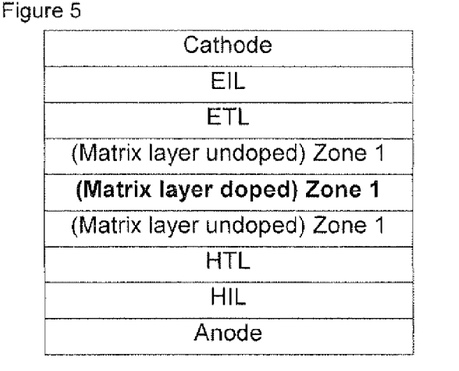

A further possible embodiment of the invention is described in FIG. 5. The matrix layer consists of one doped and two undoped regions, the two undoped regions adjoining the HTL and the ETL and the doped region being between them. Even if this is evident from the description, it should be pointed out explicitly once again that the matrix material in the doped and undoped matrix layer (both zone 1) is identical.

Figure 6:
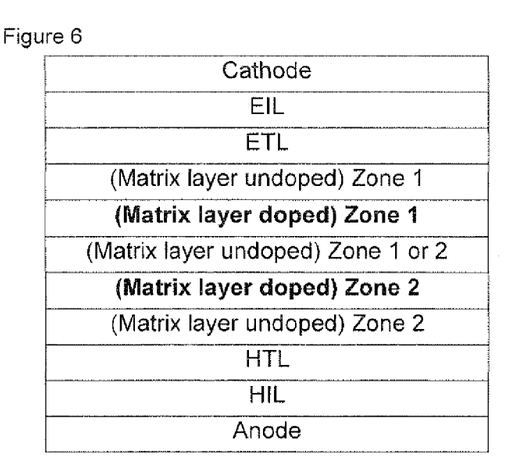

A further possible embodiment of the invention is described in FIG. 6. The matrix layer consists of two doped and three undoped regions, undoped regions adjoining the HTL and the ETL and doped and undoped regions alternating between them. Even if this is evident from the description, it should be pointed out explicitly once again that the matrix material is identical in each individual zone, and is preferably identical in all zones. In the same way, the matrix layer may also consist of three or more doped and four or more undoped regions.

Preference is given to an organic electroluminescent device, characterized in that one or more doping zones are present in the matrix layer and one or more undoped zones are present in the matrix layer and a doping zone in the matrix layer adjoins the electron transport layer ETL (or EIL or cathode) and a doping zone adjoins the hole transport layer HTL (or HIL or anode).

Figure 7:
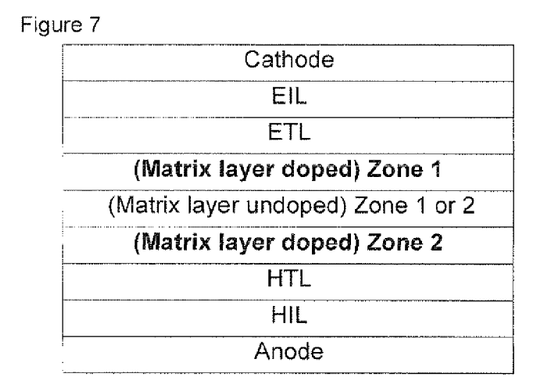

A further possible embodiment of the invention is described in FIG. 7. The matrix layer consists of one undoped and two doped regions, the two doped regions adjoining the HTL and the ETL and the undoped region being between them. Even if this is evident from the description, it should be pointed out explicitly once again that the matrix material is identical in each individual zone, and is preferably identical in all zones.

Figure 8:
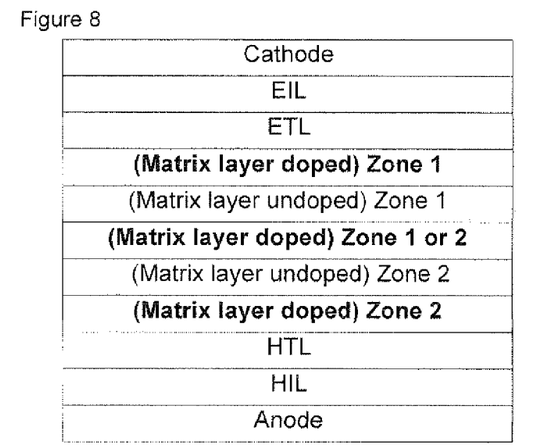

A further possible embodiment of the invention is described in FIG. 8. The matrix layer consists of two undoped and three doped regions, doped regions adjoining the HTL and the ETL and doped and undoped regions alternating between them. Even if this is evident from the description, it should be pointed out explicitly once again that the matrix material is identical in each individual zone, and is preferably identical in all zones. In the same way, the matrix layer may also consist of four or more doped or three or more undoped regions.

It is possible in principle to use different matrix materials in different zones, with the proviso that at least one contains a structural unit $X=Y$ as described above. However, not all matrix materials have to contain this structural unit. For instance, in some of the zones, it is possible, for example, for other matrix materials also to be present. For reasons of practicability and of economic viability, it has, however, been found to be advantageous when the same matrix materials are used in a plurality of zones; particular preference is given to using the same matrix materials in a plurality of adjoining zones; very particular preference is given to using the same matrix materials for all zones. In a further preferred embodiment, a different emission color which is determined by the dopant is assigned to each and every zone.

In a preferred embodiment of the invention, the inventive electroluminescent device does not comprise a separate hole blocking layer (HBL).

In a further preferred embodiment of the invention, the inventive electroluminescent device does not comprise a separate hole blocking layer (HBL) nor a separate electron transport layer (ETL), i.e. the doped or undoped portion of the matrix layer directly adjoins the cathode or the electron injection layer.

The inventive electroluminescent device also does not necessarily comprise a hole injection layer and/or hole transport layer (HIL or HTL), i.e. the doped or undoped part of the matrix layer may also directly adjoin the hole injection layer or directly adjoin the anode.

Preference is given to an organic electroluminescent device, characterized in that the layer thickness of the doping zone is between 98% and 40%, preferably between 90% and 60% of the matrix layer thickness.

Preference is given to an organic electroluminescent device, characterized in that the layer thickness of the matrix layer has a thickness of from 1 to 150 nm, preferably from 5 to 100 nm.

Preference is given to an organic electroluminescent device, characterized in that the matrix material has an absorbance of less than 0.2, preferably less than 0.1, more preferably less than 0.05, in the visible spectral region between 380 nm and 750 nm at a film thickness of 30 nm.

Preference is further given to an organic electroluminescent device, characterized in that the phosphorescent emitter present is a compound which has at least one atom of atomic number greater than 36 and less than 84.

Particular preference is given to an organic electroluminescent device, characterized in that the phosphorescent emitter comprises at least one element of atomic number greater than 56 and less than 80, most preferably molybdenum, tungsten, rhenium, ruthenium, osmium, rhodium, iridium, palladium, platinum, silver, gold or europium, especially iridium or platinum, for example according to the patent applications WO 98/01011, US 02/0034656, US 03/0022019, WO 00/70655, WO 01/41512, WO 02/02714, WO 02/15645, EP 1191613, EP 1191612, EP 1191614, WO 03/040257 and WO 03/084972.

Preference is further given to an organic electroluminescent device, characterized in that one or more layers are coated with a sublimation process. The low molecular weight materials are applied by vapor deposition in vacuum sublimation units at a pressure less than $10^{-5}$ mbar, preferably less than $10^{-6}$ mbar, more preferably less than $10^{-7}$ mbar.

Preference is likewise given to an organic electroluminescent device, characterized in that one or more layers are coated with the OVPD (organic vapor phase deposition) process or with the aid of carrier gas sublimation. In this case, the low molecular weight materials are applied at a pressure between $10^{-5}$ mbar and 1 bar.

Preference is further given to an organic electroluminescent device, characterized in that one or more layers are coated with any printing process, for example flexographic printing or offset printing, more preferably LITI (light-induced thermal imaging, thermal transfer printing) and inkjet printing.

The above-described emitting devices have the following surprising advantages over the prior art:
1. The efficiency of corresponding devices is increased in comparison to systems which do not follow the inventive design, i.e. comprise one or more separate HBLs. This is especially surprising since a comparable structure in devices which use carbazole-containing matrices leads to a great decline in the efficiency (cf. Adachi et al., *Organic Electronics* 2001, 2, 37).
2. The stability and the lifetime of corresponding devices are increased in comparison to systems which do not follow the inventive design, i.e. comprise one or more separate HBLs.
3. The operating voltages are substantially reduced; this increases the power efficiency. This is especially true when a separate electron transport layer is not used, i.e. when the matrix layer directly adjoins the cathode or the electron injection layer.
4. The layer structure is simpler because at least one organic layer fewer is used. There is a particularly distinct advantage when the matrix layer directly adjoins the cathode or the electron injection layer because, in that case, neither a separate hole blocking layer nor a separate electron transport layer has to be used. Equally, the layer structure is particularly simple when no separate hole transport layer and/or no separate hole injection layer are used.
5. The production complexity is reduced because at least one organic layer fewer is used. This is a considerable advantage in the production process, since a separate vapor deposition unit is used for each organic layer in the conventional production method, as a result of which such a unit is thus saved or completely dispensed with.
6. The emission spectrum is identical to the emission spectrum which is obtained with a doped matrix and a hole blocking material. This is essential for the application and is a surprising result especially since a partly doped matrix based on carbazole-containing compounds leads to extreme changes in the emission spectrum, so that the emission ultimately no longer comes from the triplet emitter but rather from the hole transport material (cf. Adachi et al., *Organic Electronic* 2001, 2, 37); a device with such a color shift cannot be used for the application.

Details on the statements made here can be found in the examples described below.

The present application text and also the further examples which follow are aimed only at organic light-emitting diodes and the corresponding displays. In spite of this restriction to the description, it is possible for those skilled in the art to use the corresponding inventive design also for other, related devices without any further inventive activity, for example for organic solar cells (O-SCs), organic field-effect transistors (O-FETs) or else organic laser diodes (O-lasers), to name just a few further applications.

EXAMPLES

Production and Characterization of Organic Electroluminescent Devices which Correspond to the Inventive Structure OLEDs were produced by the general process outlined below. This had to be adapted in the individual case to the particular circumstances (for example layer thickness variation to achieve optimal efficiency and color). For the production of the inventive devices, the separate hole blocking layer was omitted, and in some of the examples also the electron transport layer, and the emitter layer was configured in accordance with the above description.

Inventive electroluminescent devices can be prepared as has been described, for example, in the patent application DE10330761.3.

In the examples which follow, the results of various OLEDs are presented. The fundamental structure, and also the materials and layer thicknesses used, apart from the EML and the HBL, were identical for better comparability.

Analogously to the abovementioned general process, emitting OLEDs with the following structure were obtained:

| | |
|---|---|
| PEDOT (HIL) | 60 nm (spin-coated from water; PEDOT purchased from H. C. Starck; poly-[3,4-ethylenedioxy-2,5-thiophene]) |
| NaphDATA (HTM) | 20 nm (applied by vapor deposition; NaphDATA purchased from SynTec; 4,4',4''-tris(N-1-naphthyl-N-phenylamino)triphenylamine |
| S-TAD (HTM) | 20 nm (applied by vapor deposition; S-TAD prepared according to WO 99/12888; 2,2',7,7'-tetrakis(diphenylamino)spirobifluorene) |
| Emitter layer: | see examples in table for precise structure |
| BCP (HBL) | if appropriate, 10 nm; see comparative examples in table |
| AlQ$_3$ (ETL) | not used in all cases (see table); when present: 10 nm (applied by vapor deposition: AlQ$_3$ purchased from SynTec; tris(hydroxyquinolinato)aluminum(III)) |
| Ba—Al (cathode) | 3 nm of Ba, 150 nm of Al thereon. |

These OLEDs which were yet to be optimized were characterized in a standard manner. For this purpose, the electroluminescence spectra, the efficiency (measured in cd/A) and the power efficiency (measured in lm/W) as a function of brightness, calculated from current-voltage-brightness characteristics (IUL characteristics), and the lifetime were determined. Lifetime is understood to mean the time after which the starting brightness of the OLED has fallen by half at a constant current density of 10 mA/cm².

Table 1 summarizes the results of various examples. The composition of the overall EMLs and HBLs including the corresponding layer thicknesses is listed. In examples 1 and 2, a separate electron transport layer was used. Examples 3 to 5 describe devices both with and without a separate electron transport layer. The doped phosphorescent EMLs comprise the compound bis(9,9'-spirobifluoren-2-yl) ketone as matrix material M1, the compound bis(9,9'-spirobifluoren-2-yl) sulfoxide as matrix material M2, the compound bis(9,9'-spirobifluoren-2-yl)phenylphosphine oxide as matrix material M3 and the compound 2,7-bis(2-spiro-9,9'-bifluorenylcarbonyl)spiro-9,9'-bifluorene as matrix material M4. The syntheses of these compounds are described in the unpublished applications DE 10317556.3 and DE 10330761.3. In the adduced examples which correspond to the inventive structure, the EML consists of a 30 nm-thick doped zone and a 10 nm-thick undoped zone which follows it.

The abbreviations used in table 1 correspond to the following compounds:

TABLE 1

Ir(piq)₃

Ir(ppy)₃

BCP

Matrix material M1

Matrix material M2

TABLE 1-continued

Matrix material M3

Matrix material M4

| Experiment | EML | EML | HBL | ETL | Max. efficiency (cd/A) | Max. power efficiency (lm/W) | Voltage (V) at 100 cd/m² | CIE (x, y) | Lifetime (h) at 10 mA/cm² |
|---|---|---|---|---|---|---|---|---|---|
| Example 1a | M1: 20% Ir(piq)₃ (30 nm) | M1 (10 nm) | — | AlQ₃ (10 nm) | 6.6 | 3.7 | 5.4 | 0.69/0.31 | 12000 (extrapolated after 6000 h) |
| Example 1b (comparative) | M1: 20% Ir(piq)₃ (30 nm) | — | BCP | AlQ₃ (10 nm) | 4.6 | 2.2 | 6.5 | 0.68/0.32 | 256 |
| Example 2a | M2: 20% Ir(ppy)₃ (30 nm) | M2 (10 nm) | — | AlQ₃ (10 nm) | 16.2 | 7.9 | 6.1 | 0.33/0.61 | 356 |
| Example 2b (comparative) | M2: 20% Ir(ppy)₃ (30 nm) | — | BCP | AlQ₃ (10 nm) | 13.4 | 6.5 | 6.3 | 0.33/0.61 | 234 |
| Example 3a | M1: 20% Ir(ppy)₃ (30 nm) | M1 (10 nm) | — | AlQ₃ (10 nm) | 34.1 | 32.1 | 3.4 | 0.36/0.60 | 368 |
| Example 3b | M1: 20% Ir(ppy)₃ (30 nm) | M1 (20 nm) | — | — | 34.5 | 41.4 | 3.1 | 0.36/0.60 | 423 |
| Example 3c (comparative) | M1: 20% Ir(ppy)₃ (30 nm) | — | BCP | AlQ₃ (10 nm) | 31.8 | 15.6 | 4.8 | 0.36/0.60 | 357 |
| Example 5a | M3: 20% Ir(ppy)₃ (30 nm) | M3 (10 nm) | — | AlQ₃ (10 nm) | 32.9 | 30.1 | 3.5 | 0.36/0.60 | 336 |
| Example 5b | M3: 20% Ir(ppy)₃ (30 nm) | M3 (10 nm) | — | — | 35.3 | 33.9 | 3.2 | 0.36/0.60 | 142 |
| Example 5c (comparative) | M3: 20% Ir(ppy)₃ (30 nm) | — | BCP | AlQ₃ (10 nm) | 31.7 | 12.2 | 7.7 | 0.36/0.60 | 132 |
| Example 6a | M4: 20% Ir(piq)₃ (30 nm) | M4 (10 nm) | — | AlQ₃ (10 nm) | 6.3 | 4.5 | 5.5 | 0.69/0.31 | 17000 (extrapolated after 5000 h) |
| Example 6b | M4: 20% Ir(piq)₃ (30 nm) | M4 (10 nm) | — | — | 6.4 | 6.2 | 3.9 | 0.69/0.31 | 8400 (extrapolated after 5000 h) |
| Example 6c comparative | M4: 20% Ir(piq)₃ (30 nm) | — | BCP | AlQ₃ (10 nm) | 6.1 | 4.2 | 5.8 | 0.69/0.31 | 3700 |

Legend:
M1 = Bis(9,9'-spirobifluoren-2-yl) ketone
M2 = Bis(9,9'-spirobifluoren-2-yl) sulfoxide
M3 = Bis(9,9'-spirobifluoren-2-yl)phenylphosphine oxide
M4 = 2,7-Bis(2-Spiro-9,9'-bifluorenylcarbonyl)spiro-9,9'bifluorene FIG. 9 shows an example of the power efficiency (lm/W) in the case of doping of Ir(ppy)₃ in M1, once following the novel design principle (according to experiment 3a, ▲) and once corresponding to the comparative standard (according to experiment 3c, ♦). The power efficiency from experiment 3a is about twice as high. The power efficiency (according to experiment 3b, ●) without HBL and without ETL is about 30 to 50% higher again.

The same observation as shown for example 3 is also made for the other examples, as can be taken from table 1.

In summary, it can be stated that OLEDs manufactured by the novel design principle have a higher efficiency at lower voltage and longer lifetimes, as can be seen readily from table 1. This applies to all matrix materials and matrix material classes described, as demonstrated here in the examples for ketones, phosphine oxides and sulfoxides. Especially when no separate electron transport layer is used, i.e. the matrix layer directly adjoins the cathode or the electron injection layer, the voltage is particularly low and thus the power efficiency is particularly high.

What is claimed is:

1. An organic electroluminescent device, comprising: an anode;
a cathode; and
at least one matrix layer, comprising at least one matrix material, wherein
the matrix material comprises a compound of the formulas (2) or (4)

(2)

(4)

wherein:
X is O; and
Y is C or S in formula (2), and S in formula (4);
R is the same or different at each instance and is an aromatic or heteroaromatic ring system or an aryloxy group which has from 1 to 40 carbon atoms and is optionally substituted by one or more substituents selected from: $R^1$, CN, $B(R^2)_2$ or $Si(R^2)_3$ radicals, and further wherein a plurality of substituents R together optionally forms an aromatic or heteroaromatic ring system;
$R^1$ is the same or different at each instance and is a straight-chain, branched or cyclic alkyl or alkoxy chain having from 1 to 22 carbon atoms, in which one or more non-adjacent carbon atoms is optionally replaced by $-R^2C=CR^2-$, $-C\equiv C-$, $Si(R^2)_2$, $Ge(R^2)_2$, $Sn(R^2)_2$, $-NR^2-$, $-O-$, $-S-$, $CO-O-$ or $-O-CO-O-$, where one or more hydrogen atoms may also be replaced by fluorine, an aryl, heteroaryl or aryloxy group which has from 1 to 40 carbon atoms and may also be substituted by one or more $R^2$ radicals, or OH or $N(R^2)_2$;
$R^2$ is the same or different at each instance and is H or an aliphatic or aromatic hydrocarbon radical having 1 to 20 carbon atoms;
with the proviso that the molar mass of the matrix material is greater than 150 g/mol; and
further wherein said matrix layer includes at least one sublayer doped with at least one phosphorescent emitter adjacent to at least one undoped sublayer and
wherein at least one of the R radicals includes a quaternary atom and at least one of the R radicals contains a 9,9'-spirobifluorene derivative, a 9,9-disubstituted fluorene derivative, a 6,6- and/or 12,12-di- or tetrasubstituted indenofluorene derivative, a triptycene derivative, a dihydrophenanthrene derivative, a hexaarylbenzene derivative or a tetraarylmethane derivative.

2. The organic electroluminescent device of claim 1, characterized in that at least one of the R radicals includes a 9,9'-spirobifluorene derivative.

3. The organic electroluminescent device of claim 1, wherein the glass transition temperature $T_g$ of the matrix material is greater than 100° C.

4. The organic electroluminescent device of claim 1, wherein the organic electroluminescent device optionally further comprises one or more hole injection layers (HIL) and/or one or more hole transport layers (HTL).

5. The organic electroluminescent device as claimed in claim 4, wherein the organic electroluminescent device optionally further comprises one or more electron transport layers (ETL) and/or one or more electron injection layers (EIL).

6. The organic electroluminescent device of claim 5, wherein the matrix layer further comprises one or more doped zones and one or more undoped zones, and further wherein the undoped zone in the matrix layer adjoins one of the electron transport layer (ETL), the electron injection layer (EIL), or the cathode, and the doped zone in the matrix layer adjoins one of the hole transport layer (HTL), hole injection layer (HIL), or the anode.

7. The organic electroluminescent device of claim 5, wherein the matrix layer further comprises one or more doped zones and one or more undoped zones, and further wherein the undoped zone in the matrix layer adjoins one of the hole transport layer (HTL), the hole injection layer (HIL), or the anode, and the doped zone in the matrix layer adjoins one of the electron transport layer (ETL), electron injection layer (EIL), or the cathode.

8. The organic electroluminescent device of claim 5, wherein the matrix layer further comprises one or more doped zones and one or more undoped zones, and further wherein at least one of the undoped zones in the matrix layer adjoins one of the electron transport layer (ETL), the electron injection layer (EIL), or the cathode, and at least one of the undoped zones adjoins one of the hole transport layer (HTL), the hole injection layer (HIL), or the anode.

9. The organic electroluminescent device of claim 5, wherein the matrix layer further comprises one or more doped zones and one or more undoped zones, and further wherein at least one of the doped zones in the matrix layer adjoins one of the electron transport layer (ETL), the electron injection layer (EIL), or the cathode and at least one of the doped zones adjoins one of the hole transport layer (HTL), the hole injection layer (HIL), or the anode.

10. The organic electroluminescent device of claim 5, wherein the matrix layer further comprises one or more doped zones and one or more undoped zones, and further wherein the doped or the undoped matrix sublayer directly adjoins the cathode or the electron injection layer (EIL).

11. The organic electroluminescent device of claim 5, wherein the matrix layer further comprises one or more doped zones and one or more undoped zones, and further wherein the doped or the undoped matrix sublayer directly adjoins the hole injection layer (HIL) or the anode.

12. The organic electroluminescent device of claim 1, wherein the matrix layer further comprises one or more doped zones and one or more undoped zones, and further wherein the thickness of the doped zone is between 98% and 40% of the matrix layer thickness.

13. The organic electroluminescent device of claim 1, wherein the thickness of the matrix layer is from 1 to 150 nm.

14. The organic electroluminescent device of claim 1, wherein the matrix material has an absorbance of less than 0.2 in the visible spectral region between 380 nm and 750 nm at a film thickness of 30 nm.

15. The organic electroluminescent device of claim 1, wherein the phosphorescent emitter has at least one atom of atomic number greater than 36 and less than 84.

16. The organic electroluminescent device of claim 15, wherein the phosphorescent emitter comprises molybdenum, tungsten, rhenium, ruthenium, osmium, rhodium, iridium, palladium, platinum, silver, gold or europium.

17. The organic electroluminescent device of claim 1, wherein one or more layers are produced with a sublimation process.

18. The organic electroluminescent device of claim 1, wherein one or more layers are applied with an organic vapor phase deposition (OVPD) process.

19. The organic electroluminescent device of claim 1, wherein one or more layers are coated with a printing process.

20. The organic electroluminescent device of claim 19, wherein one or more layers are coated with a LITI (light-induced thermal imaging) process.

21. The organic electroluminescent device of claim 19, wherein one or more layers are coated with an inkjet printing process.

* * * * *